United States Patent
Chou et al.

(10) Patent No.: US 7,403,064 B2
(45) Date of Patent: Jul. 22, 2008

(54) DYNAMICALLY ACCELERATED OPERATIONAL AMPLIFIER AND METHOD THEREOF

(75) Inventors: Gerchih Chou, San Jose, CA (US); Chia-Liang Lin, Union City, CA (US); Ming-Je Tsai, Milpitas, CA (US)

(73) Assignee: Realtek Semiconductor Corp., HsinChu (TW)

( * ) Notice: Subject to any disclaimer, the term of this patent is extended or adjusted under 35 U.S.C. 154(b) by 146 days.

(21) Appl. No.: 11/308,309

(22) Filed: Mar. 16, 2006

(65) Prior Publication Data

US 2007/0216475 A1 Sep. 20, 2007

(51) Int. Cl.
*H03F 1/02* (2006.01)
(52) U.S. Cl. ............................................. 330/9
(58) Field of Classification Search ................ 330/9, 330/310, 152, 124; 327/124
See application file for complete search history.

(56) References Cited

U.S. PATENT DOCUMENTS

| 5,825,250 | A | 10/1998 | Tomasini et al. | |
| 7,164,298 | B2 * | 1/2007 | Sung | 327/112 |
| 2006/0091955 | A1 * | 5/2006 | Choi | 330/260 |

OTHER PUBLICATIONS

Todd Sepke et al, "Comparator-Based Switched-Capacitor Circuits For Scaled CMOS Technologies", ISSCC 2006 / Session 12 / Nyquist ADCs / 12.4, Feb. 7, 2006, pp. 220-221, pp. 649, 2006 IEEE International Solid-State Circuits Conference.

* cited by examiner

*Primary Examiner*—Robert Pascal
*Assistant Examiner*—Hieu P Nguyen
(74) *Attorney, Agent, or Firm*—Winston Hsu

(57) ABSTRACT

An operational amplifier is dynamically accelerated depending on its internal state. Acceleration is disabled when the internal state indicates a risk of instability. When the internal state of the operational amplifier indicates no risk of instability, the acceleration is turned on to speed up the circuit operation.

19 Claims, 5 Drawing Sheets sampling phase
(A)

transfer phase
(B)

(A) (B)

DYNAMICALLY ACCELERATED OPERATIONAL AMPLIFIER AND METHOD THEREOF

BACKGROUND OF THE INVENTION

1. Field of the Invention

The present invention relates to operational amplifier, in particular to an operational amplifier that is dynamically accelerated.

2. Description of Related Art

Operational amplifier (opamp in short) is an important circuit building block for numerous applications. Depending on its target application, an opamp usually needs to satisfy a list of requirements, for example: DC gain, unit-gain bandwidth, phase margin, slew-rate, and so on. Opamp is usually used in a closed-loop circuit configuration, where the overall circuit precision and linearity is determined by its DC gain, and the overall circuit speed is determined by unit-gain bandwidth (for small signal input) or slew-rate (for large signal input), while the stability of the circuit is determined by the phase margin. It is very difficult to design a high DC gain amplifier with a high unit-gain bandwidth and/or a high slew-rate while at the same time having a comfortable stability margin. To ensure good stability, compensation technique is usually employed in an opamp design. Compensation, however, reduces the unit-gain bandwidth and/or the slew rate.

An application (of operational amplifier) of particular interest pertaining to the subject matter of the present invention is switch-capacitor circuit. A typical switch-capacitor circuit works in a two-phase manner. The two phases are "sampling" phase and "transfer" phase, and their operations are controlled by a plurality of clock signals. In a typical two-phase switch-capacitor circuit working at a sampling rate of f, the duration of each phase is roughly half of the sampling clock period T=1/f. FIG. 1 depicts a circuit configuration for a typical two-phase switch capacitor circuit. During sampling phase, the input voltage VIN is sampled into the sampling capacitor C1, as shown in FIG. 1A. During transfer phase, the charge stored on the sampling capacitor C1 is transferred to the integrating capacitor C2 via the opamp circuit comprising an opamp 110, as shown in FIG. 1B. Opamp 110 is connected in an inverting amplification configuration, where the positive input terminal is connected to ground and the negative input terminal is connected to both the sampling capacitor C1 and the integrating capacitor C2. After the circuit settles in the transfer phase, the output voltage VOUT will be VIN·C1/C2. Although the switch-capacitor circuit depicted in FIG. 1B is a single-ended circuit, in practice most switch-capacitor circuits are implemented using fully differential circuits.

A typical waveform of the output voltage VOUT of the switch-capacitor circuit 100 of FIG. 1B during transfer phase is shown in FIG. 2A. Here, the transfer phase starts at time 0. The charge stored at C1 is transferred to the integrating capacitor C2. Consequently the output voltage VOUT, which is the voltage across the load capacitor CL, rises gradually and eventually settles to the final value VIN·C1/C2. Due to the finite driving capability of the opamp 110, the charge transfer process actually goes through two phases: "slewing" phase and "linear settling" phase. Initially, the output voltage VOUT rises linearly with time, no matter how large the differential input voltage at the opamp 110 is. During the duration where the output voltage increases linearly with time, opamp 110 is said to be slewing as it is driven at its maximum capacity. As the output voltage VOUT comes close enough to the final settled value VIN·C1/C2, at a time instant denoted as $t_s$ in FIG. 2, opamp 110 no longer needs to be driven at its maximum capacity. Then, the opamp enters the linear settling phase, where the output voltage VOUT increases at a slower rate than it does during the slewing phase. FIG. 2B depicts the corresponding waveform of the current IC2 flowing through the capacitor C2. During the slewing phase, the current IC2 stays at a constant value IC2MAX determined by the maximum driven capability of the opamp 110. After it enters the linear settling phase, the current IC2 exponentially decays toward zero. At the timing instant $t_s$, the current makes a smooth transition from staying constant to delaying exponentially. The purpose of the switch-capacitor circuit 100 is to transfer the charge from the input capacitor C1 to the integrating capacitor C2. Therefore, the switch-capacitor is more efficient in slewing phase (than in linear settling phase) as the current IC2 is higher and thus the charge is transferred faster. In prior art, however, a switch-capacitor circuit during transfer phase usually spends comparable amounts of time in slewing and linear settling. Therefore, it needs to have a sufficiently high slew-rate and also a sufficiently high unit-gain bandwidth to meet the overall timing budget. As mentioned above, it is difficult to achieve both high unit-gain bandwidth and high slew rate while ensuring comfortable stability.

BRIEF SUMMARY OF THIS INVENTION

It is therefore one objective of the claimed invention to provide an operational amplifier. The driving capability of the operational amplifier is adjustable and can be dynamically controlled.

It is therefore one objective of the claimed invention to provide an operational amplifier to achieve both high unit-gain bandwidth and high slew rate.

In an embodiment, an operational amplifier is disclosed, the operation amplifier comprising: an adjustable core circuit comprising at least two amplification stages and at least two configurations of different driving capabilities, and an acceleration controller receiving at least a voltage signal of a node within the core circuit and generating a control signal to select a configuration.

In an embodiment, a method of dynamically controlling an operational amplifier having at least two configurations of different driving capabilities is disclosed, the method comprising: receiving at least a voltage signal of a node within the operational amplifier, detecting the internal state of the operational amplifier based on the voltage signal, and selecting a configuration according to the detected internal state.

BRIEF DESCRIPTION OF THE DRAWINGS

The subject matter regarded as the invention is particularly pointed out and distinctly claimed in the concluding portion of the specification. The invention, both as to device and method of operation, together with features and advantages thereof may best be understood by reference to the following detailed description with the accompanying drawings in which:

DETAILED DESCRIPTION OF THIS INVENTION

The present invention relates to dynamically accelerated operational amplifier. While the specifications describe several example embodiments of the invention considered best modes of practicing the invention, it should be understood that the invention can be implemented in many ways and is not limited to the particular examples described below or to the particular manner in which any features of such examples are implemented.

In an embodiment, a dynamically accelerated opamp (operational amplifier) is disclosed. In the dynamically accelerated opamp, the driving capability of the opamp is adjustable and can be dynamically controlled.

Figure 3:
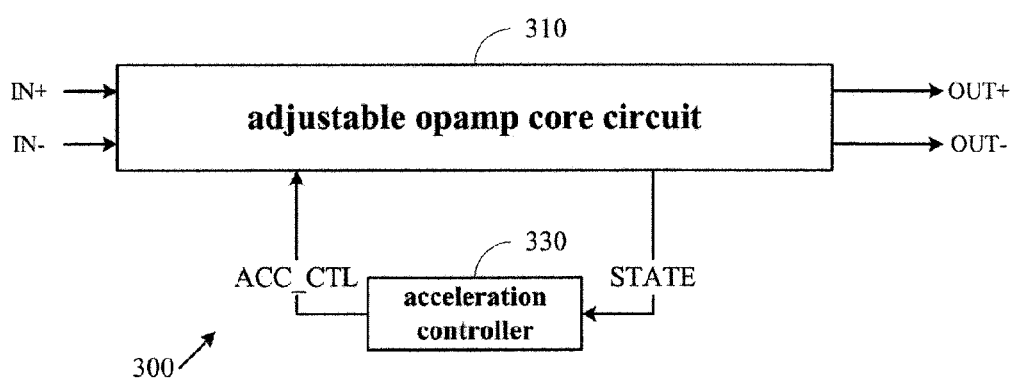
FIG. 3 depicts an exemplary embodiment of an operational amplifier according to this invention.

In a further embodiment, the driving capability of the dynamically accelerated opamp is enhanced when there is no risk of instability. As illustrated in FIG. 3, an embodiment of a operational amplifier 300 according to this invention comprises an adjustable opamp core circuit 310 and an acceleration controller 330. The adjustable opamp core circuit 310 has at least two configurations; each corresponds to a different driving capability. The stewing controller 330 receives a STATE signal from the adjustable opamp core circuit 310 and generates an ACC_CTL signal to determine which configuration to be used for the adjustable opamp core circuit 310. The STATE signal comprises at least a voltage of a node within the adjustable opamp core circuit.

Figure 1:
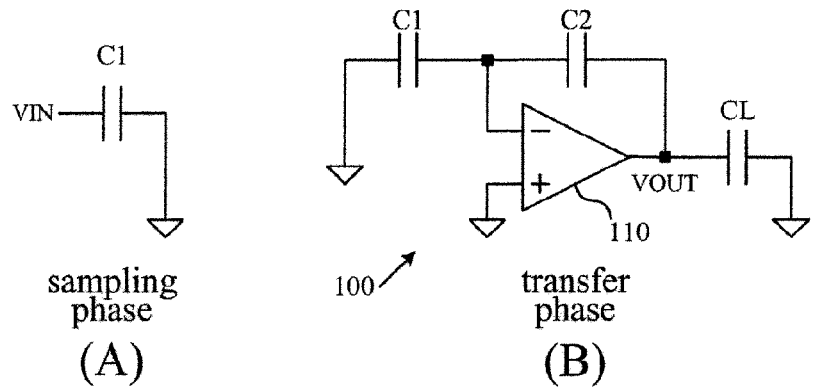
FIG. 1 illustrates two-phase operation of a prior art switch-capacitor circuit.
Figure 2:
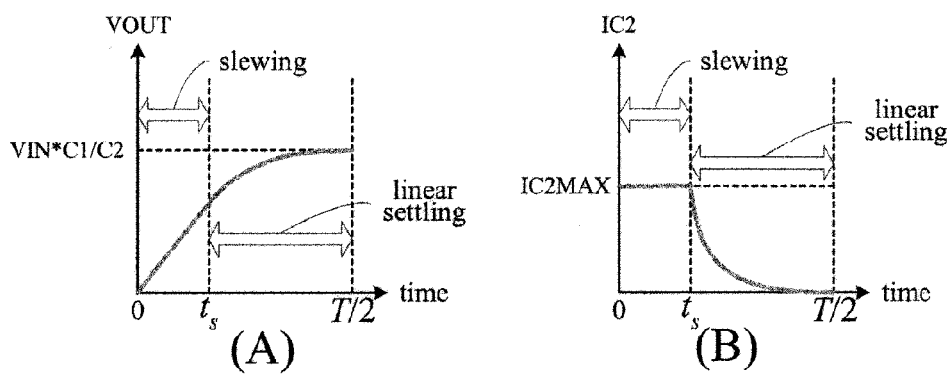
FIG. 2 depicts the voltage and current waveforms for the switch-capacitor circuit of FIG. 1 during charge transfer.
Figure 4:
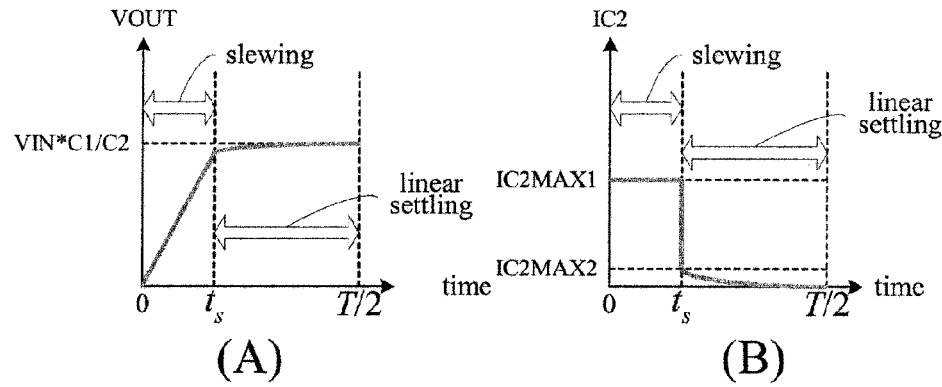
FIG. 4 depicts the voltage and current waveforms for a switch-capacitor circuit during charge transfer using the opamp of FIG. 3.

The dynamically accelerated opamp 300 is suitable for a switch-capacitor circuit application depicted in FIG. 1B. In such an application, the dynamically accelerated opamp 300 is used to replace opamp 110. The driving capability of the opamp 300 is dynamically controlled so that the driving capability is enhanced to make the charge transfer faster during slewing or the duration where the output is still far away from its final settled value and thus there is no concern of stability. FIG. 4A depicts an illustrative waveform of the output voltage VOUT for the switch-capacitor circuit depicted in FIG. 1B using a dynamically accelerated opamp 300. The slope of voltage change is much greater in the slewing phase than the linear settling phase. FIG. 4B depicts an illustrative waveform of the current IC2 flowing through the integrating capacitor C2. During the slewing phase, the current IC2 stays at a constant value IC2MAX1. At the time instant $t_s$, the enhancement of driving capability is disabled and thus the current IC2 drops abruptly to a much lower value IC2MAX2 and then decays exponentially as it is linearly settling. The time instant $t_s$, at which the configuration of the adjustable opamp circuit 310 switches from the accelerated mode to the normal (no acceleration) mode, is determined by the accelerator controller 330 by detecting the state of the opamp core circuit 310.

Figure 5:
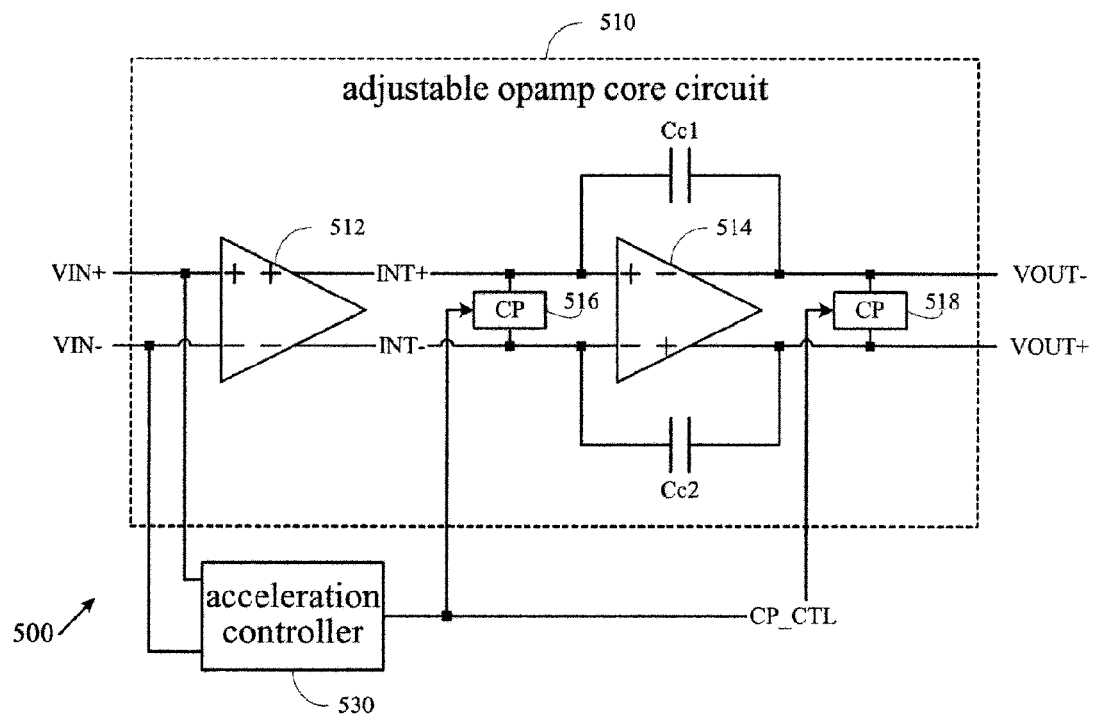
FIG. 5 depicts an exemplary implementation of the opamp of FIG. 3.

An exemplary embodiment of the present invention suitable for switch-capacitor circuit application is shown in FIG. 5. Here, a dynamically accelerated opamp circuit 500, receiving a differential input signal VIN+/− and generating a differential output signal VOUT+/−, comprises an adjustable opamp core circuit 510 and an acceleration controller 530. Opamp core circuit 510 comprises two stages of amplification circuits. The first stage is a differential amplifier 512, which receives the differential input signal VIN+/− and generates an inter-stage signal INT+/−. The second stage is a differential amplifier 514, which receives the inter-stage signal INT+/− and generates the differential output signal VOUT+/−. A pair of compensation capacitors, Cc1 and Cc2, is used to connect the input with the output of the second stage; the two capacitors implement the so-called "Miller compensation" scheme that is well known in prior art and thus not explained in detail here. In addition, there are two charge pump (CP) circuits 516 and 518 that inject charges to the input and the output of the second stage, respectively. CP circuits 516 and 518 are controlled by a signal CP_CTL, which is generated by the acceleration controller 530. Acceleration controller 530 receives the differential input VIN+/− and generates the CP_CTL signal to control the two CP circuits. The two charge pumps 516 and 518 serve as an acceleration circuit to speed up the opamp circuit. When the two charge pumps are disabled, the opamp core circuit 510 is said to be in the normal mode; when the two charge pumps are enabled, the opamp core circuit 510 is said to be in the accelerated mode.

Figure 6:
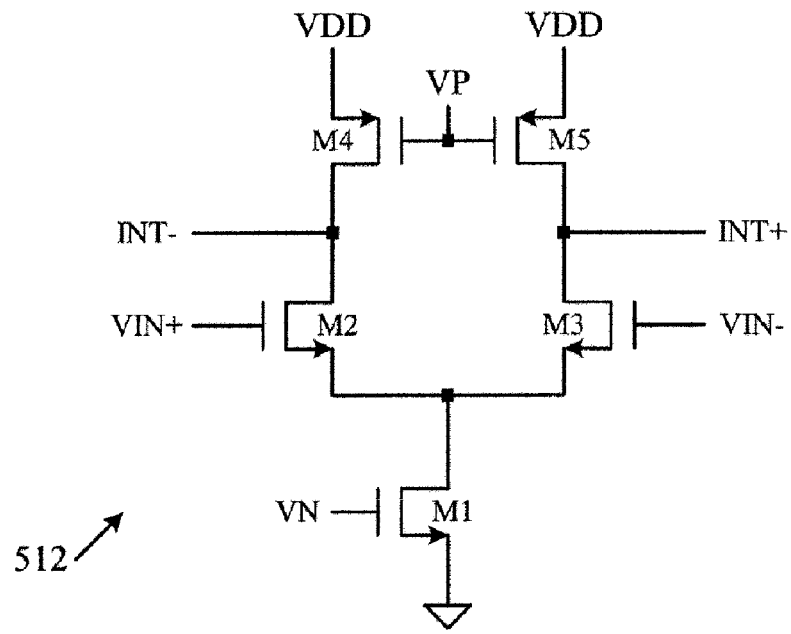
FIG. 6 depicts an exemplary embodiment of the first stage amplification for the opamp of FIG. 5.

An exemplary embodiment of the first stage of amplification 512 is illustrated by the schematic shown in FIG. 6. Here, the first stage 512 is a differential amplifier comprising an NMOS (N-type Metal Oxide Semiconductor) bias transistor M1, a differential pair of NMOS amplification transistors M2-M3, and a pair of PMOS (P-type Metal Oxide Semiconductor) transistor loads M4-M5. Here, VDD denotes a supply voltage, VP is a bias voltage for PMOS transistors M4 and M5, and VN is a bias voltage for NMOS transistors M1.

Figure 7:
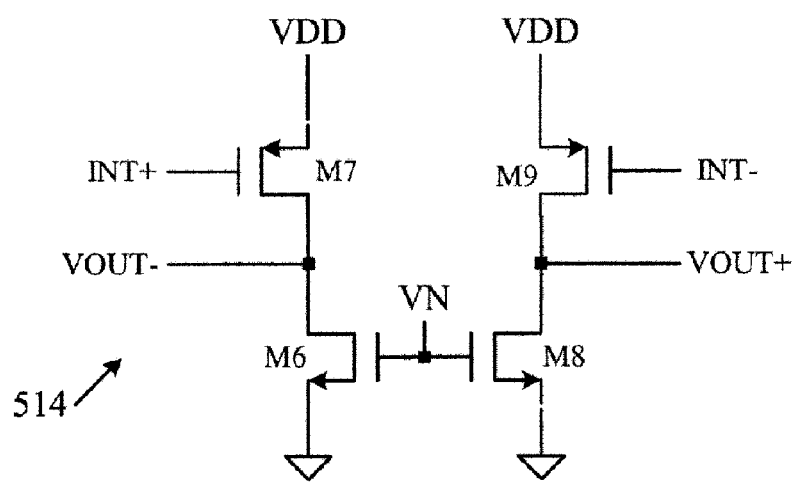
FIG. 7 depicts an exemplary embodiment of the second stage amplification for the opamp of FIG. 5.

An exemplary embodiment of the second stage of amplification 514 is illustrated by the schematic shown in FIG. 7. Here, the second stage is a pair of common source amplifiers comprising PMOS transistors M7 and M9 for amplification and NMOS transistors M6 and M8 for biasing. Here, VDD denotes a supply voltage, and VN is a bias voltage for NMOS transistors M6 and M8.

For those of ordinary skill in the art, the principle of these two-stage amplification circuits are self-explanatory and thus are not described in detail here. Also, numerous alternative architectures can be employed without departing from the scope of the present invention. For example, one may replace the first stage by a differential telescopic cascode amplifier or a folded cascode amplifier. Also, one may employ more than two stages of amplification.

Figure 8:
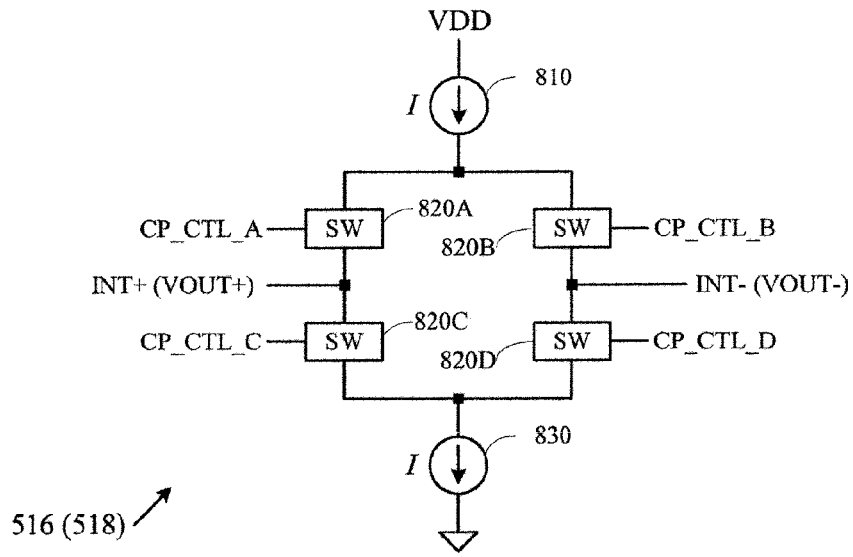
FIG. 8 depicts a schematic diagram for the charge pump circuit for the opamp of FIG. 5.

FIG. 8 depicts a schematic diagram of a charge pump circuit suitable for implementing CP 516 and CP 518 of FIG. 5. Here, CP 516 (518) comprises a current source 810 of magnitude /, a current sink 830 of magnitude /, and four switches 820A, 820B, 820C, and 820D, controlled by four logical signals CP_CTL_A, CP_CTL_B, CP_CTL_C, and CP_CTL_D, respectively. Each switch is turned on or off depending on its respective control signal. Those four logical signals form the control signal CP_CTL generated by the acceleration controller 530 (see FIG. 5). There are three distinct settings for the control signal CP_CTL: POS, NEG, and DISABLE. For the POS setting, one sets CP_CTL_A=1, CP_CTL_B=0, CP_CTL_C=0, and CP_CTL_D=1, and effectively injects a current of / into the node INT+ (VOUT+) and drains a current of / from the node INT− (VOUT−). For the NEG setting, one sets CP_CTL_A=0, CP_CTL_B=1, CP_CTL_C=1, and CP_CTL_D=0, and effectively injects a current of / into node INT− (VOUT−) and drains a current of / from the node INT+ (VOUT+). For the DISABLE setting, one sets all the four control signals to 0 and effectively disconnects charge pump circuit CP 516 (518) from the rest of the adjustable opamp core circuit 510. In a further embodiment not shown in the figure, both current source 810 and current sink 830 are powered off during the DISABLE setting to save power.

Figure 9:
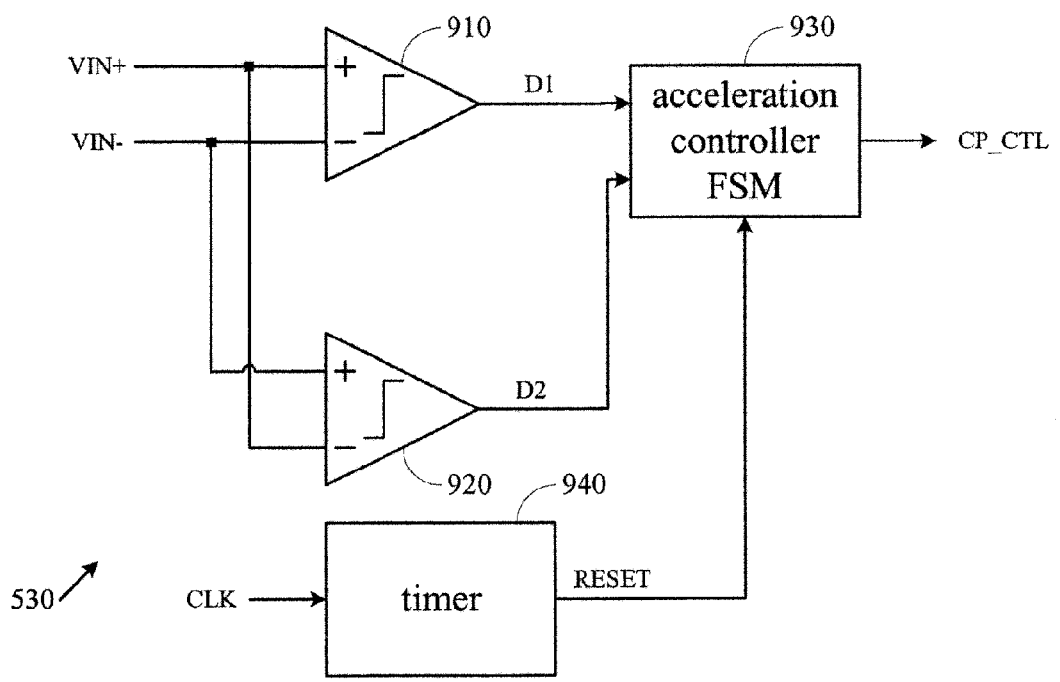
FIG. 9 depicts an exemplary embodiment for the acceleration controller for the opamp of FIG. 5.

By way of example but not limitation, FIG. 9 depicts an embodiment for the acceleration controller 530 of FIG. 5. Acceleration controller 530 comprises two comparators 910 and 920, an acceleration controller FSM (finite state machine) 930, and a timer circuit 940. Timer circuit 940 receives a clock signal CLK and generates accordingly a RESET signal. Comparator 910 compares VIN+ with VIN− and generates a logical D1 signal. Comparator 920 compares VIN− with VIN+ and generates a logical D2 signal. Compensation controller FSM 930 receives D1, D2, and RESET, and generates the CP_CTL signal to control the two charge pump circuits 516 and 518.

Both comparators 910 and 920 are offset toward the same polarity. By a way of example but not limitation, both comparators are offset negatively and will be reset to 0 upon the assertion of the RESET signal. A negatively offset comparator means the output is 0 unless the input difference (between the "+" terminal and the "−" terminal) is greater than a certain offset amount Vb. A typical offset amount suitable for the present invention is 5 mV. Besides, both comparators have a certain degree of hysteresis. The phenomenon of hysteresis is briefly explained as follows. For a zero-offset comparator without hysteresis, the output is 1 when the input difference is greater than zero, and 0 otherwise. For a zero-offset comparator with hysteresis, the instantaneous output does not solely depend on the instantaneous input. If the current value of the comparator output is 1, then the output remains 1 and will not flip to 0 until the input difference is lower than $-Vh^+$, where $Vh^+$ is a hysteresis amount for the positive output state 1; if the current value of the comparator output is 0, then the output remains 0 and will not flip to 1 until the input difference is higher than $Vh^-$ where $Vh^-$ is a hysteresis amount for the negative output state 0. Both comparators 910 and 920 are offset and also have a hysteresis, but the hysteresis amount must be smaller than the offset amount, i.e. $Vb>Vh^+$ and $Vb>Vh^-$.

Figure 10:
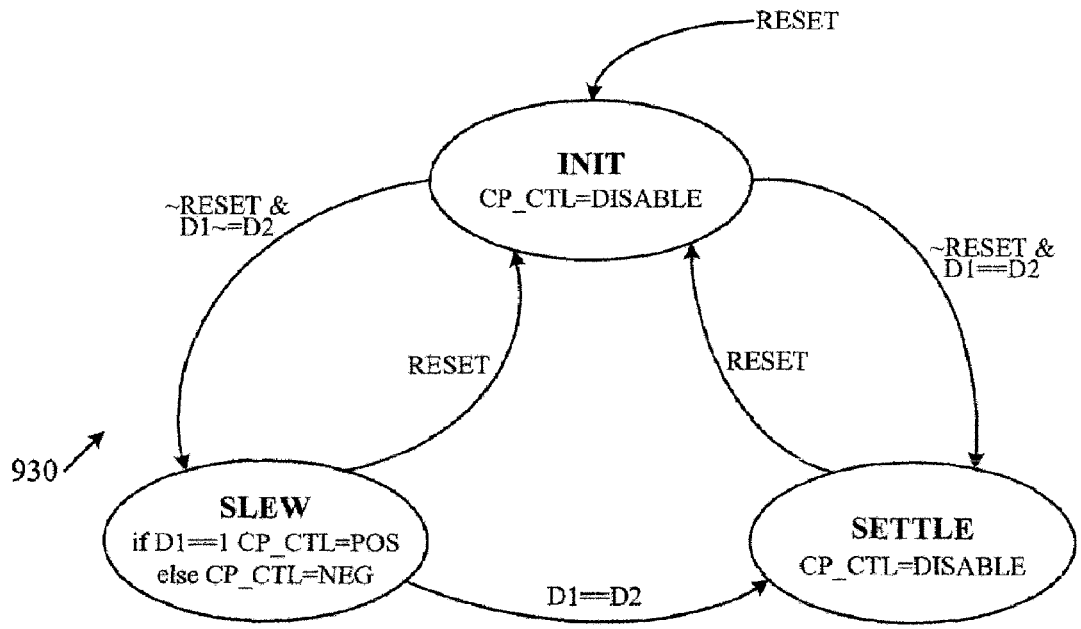
FIG. 10 depicts a state diagram for the acceleration controller of FIG. 9.

FIG. 10 depicts an exemplary embodiment for the compensation controller FSM 930 of FIG. 9. In this embodiment, there are three states in the FSM: INIT, SLEW, and SETTLE. Upon the assertion of RESET, the FSM enters the INIT state, where the CP_CTL signal is set to DISABLE to turn off both charge pumps 516 and 518. The FSM stays in the INIT state and can transit to other states only after the RESET signal is de-asserted. After the de-assertion of RESET, FSM compares D1 with D2. When D1 is not equal to D2, it indicates there is a significant difference between VIN+ and VIN− so that the offset and hysteresis in one of the two comparators have been overcome. A significant difference between VIN+ and VIN− suggests the opamp is far from being settled. In this case, the FSM must transit to the SLEW state, where CP_CTL is set to POS if D1 is 1 and set to NEG otherwise. In either scenario (D1==1 or D1==0), both charge pumps 516 and 518 accelerate the opamp by providing an additional current to speed up the charge transfer. At any time after the de-assertion of the RESET signal and before the assertion of next RESET pulse, if the FSM detects D1 is equal to D2, the FSM will transit to the SETTLE state. This happens when the difference between VIN+ and VIN− is too small to overcome the offset and hysteresis of the comparators. In SETTLE state, the FSM disables the opamp acceleration by setting CP_CTL to DISABLE. The RESET signal is asserted for a duration that is a fraction of the period of the clock CLK for every cycle of CLK. In this manner, the FSM is reset to the INIT state for every charge transfer phase.

Figure 11:
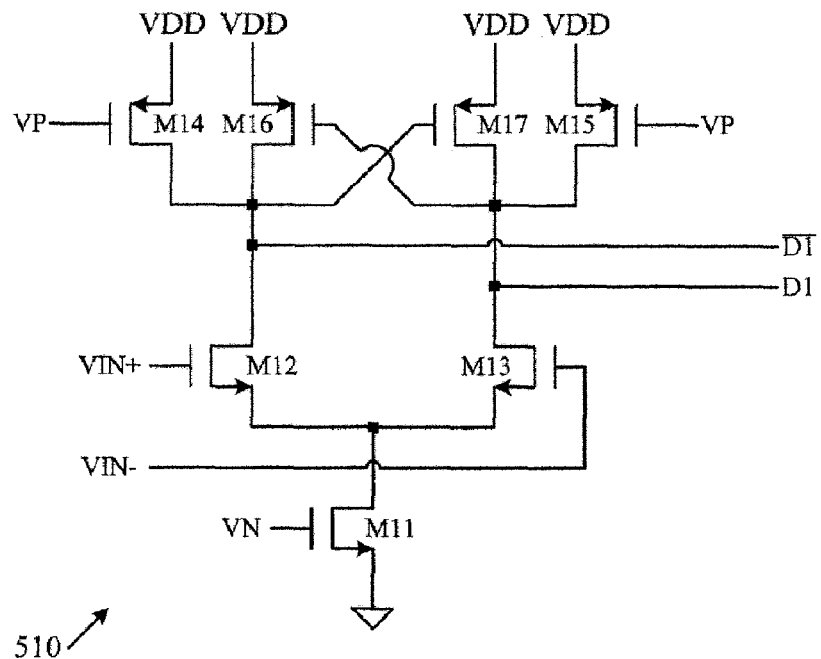
FIG. 11 depicts a comparator for the acceleration controller of FIG. 10.

FIG. 11 depicts a circuit schematic diagram of an exemplary embodiment of comparator 910. Comparator 910 comprises a differential pair of NMOS transistors M12-M13, biased by a tail current provided by a NMOS transistor M11 and loaded with a pair of PMOS transistors M14-M15. There is also an additional regenerative load comprising cross-coupled PMOS pair M16-M17, which is used to provide hysteresis. VDD is a supply voltage, VN is a bias voltage for NMOS transistor M11, and VP is a bias voltage for PMOS transistors M14-M15. The comparator output D1 is taken at the drain of the NMOS transistor M13. To make the comparator offset negatively, the width-to-length ratio for M13 must be greater than that of M12. Many alternative comparator architectures may be employed without departing from the principle taught by the present invention.

For those of ordinary skill in the art, comparators 910 and 920 can be offset positively without departing from the principle taught by the present invention. Also, one may choose to make comparators 910 and 920 both compare VIN+ with VIN− (instead of having comparator 920 compares VIN− with VIN+ as shown in FIG. 9) but make them offset toward opposite polarities. In that case, D2 must be replaced with the logical inversion of D2.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operational amplifier comprising:
   an adjustable core circuit comprising at least two amplification stages and at least two configurations of different driving capabilities, and
   an acceleration controller receiving at least a voltage signal of a node within said adjustable core circuit and generating a control signal to select one of said configurations;
   wherein the acceleration controller comprises at least one comparator for receiving the voltage signal and generating a comparator output signal, and the acceleration controller generates the control signal based on the comparator output signal.

2. The operational amplifier of claim 1, wherein said configurations include at least a normal mode and an accelerated mode, where the accelerated mode provides higher driving capability than the normal mode.

3. The operational amplifier of claim 1, wherein the adjustable core circuit further comprises a charge pump circuit; wherein selecting one of said configurations comprises either disabling the charge pump circuit, or enabling the charge pump circuit.

4. The operational amplifier of claim 1, wherein the accelerator controller comprises at least one comparator for receiving the voltage signal and generating a comparator output signal, a timer circuit for generating a logical signal, and a finite state machine (FSM) for receiving the comparator output signal and the logical signal and generating the control signal to select one of said configurations.

5. The operational amplifier of claim 4, wherein the at least one comparator is offset and has a hysteresis.

6. The operational amplifier of claim 5, wherein the FSM comprises at least three states, say a first state, a second state, and a third state.

7. The operational amplifier of claim 6, wherein upon the assertion of the logical signal the FSM enters the first state.

8. An operational amplifier comprising:
an adjustable core circuit comprising at least two amplification stages and at least two configurations of different driving capabilities, and
an acceleration controller receiving at least a voltage signal of a node within said adjustable core circuit and generating a control signal to select one of said configurations;
wherein the accelerator controller comprises at least one comparator for receiving the voltage signal and generating a comparator output signal, a timer circuit for generating a logical signal, and a finite state machine (FSM) for receiving the comparator output signal and the logical signal and generating the control signal to select one of said configurations.

9. The operational amplifier of claim 8, wherein the at least one comparator is offset and has a hysteresis.

10. The operational amplifier of claim 9, wherein the FSM comprises at least three states, say a first state, a second state, and a third state.

11. The operational amplifier of claim 10, wherein upon the assertion of the logical signal the FSM enters the first state.

12. The operational amplifier of claim 11, wherein after the de-assertion of the logical signal the FSM transits to the second state, if the two comparator outputs indicate the voltage signal has a large magnitude, or else to the third state.

13. The operational amplifier of claim 12, wherein FSM sets the control signal to disable the charge pump circuit in the first state and the third state, and sets the control signal to enable the charge pump circuit in the second state.

14. The operational amplifier of claim 8, wherein said configurations include at least a normal mode and an accelerated mode, where the accelerated mode provides higher driving capability than the normal mode.

15. The operational amplifier of claim 14, wherein the adjustable core circuit further comprises a charge pump circuit; wherein the acceleration controller disables the charge pump circuit in the normal mode by, and enables the charge pump circuit in the accelerated mode.

16. A method of controlling an operational amplifier having at least two configurations of different driving capabilities, the method comprising:
receiving at least a voltage signal of a node within the operational amplifier;
detecting the internal state of the operational amplifier based on the voltage signal; and
selecting a configuration according to the detected internal state;
wherein said configurations include at least a normal mode and an accelerated mode, where the accelerated mode provides higher driving capability than the normal mode;
wherein the step of detecting further comprises using at least one comparator to determine the range of the voltage signal.

17. The method of claim 16, wherein selecting one of said configurations comprises either selecting the normal mode by disabling the charge pump circuit, or selecting the accelerated mode by enabling the charge pump circuit.

18. The method of claim 16, wherein the operational amplifier further comprises a charge pump circuit; wherein the selecting further comprises receiving an output from the at least one comparator, and enabling or disabling the charge pump according to the output of the at least one comparator.

19. The method of claim 16, wherein the operational amplifier further comprises a charge pump circuit that is enabled or disenabled according to the detected internal state.

* * * * *